US012125733B2

(12) United States Patent
Uchiyama (10) Patent No.: US 12,125,733 B2
(45) Date of Patent: Oct. 22, 2024

(54) SUBSTRATE FIXING DEVICE, ELECTROSTATIC CHUCK AND METHOD OF MANUFACTURING ELECTROSTATIC CHUCK (71) Applicant: SHINKO ELECTRIC INDUSTRIES CO., LTD., Nagano (JP)

(72) Inventor: Aya Uchiyama, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 93 days.

(21) Appl. No.: 17/743,011

(22) Filed: May 12, 2022

(65) Prior Publication Data
US 2022/0367228 A1 Nov. 17, 2022

(30) Foreign Application Priority Data
May 14, 2021 (JP) ................. 2021-082742

(51) Int. Cl.
H01L 21/683 (2006.01)
H01L 21/67 (2006.01)

(52) U.S. Cl.
CPC .... *H01L 21/6833* (2013.01); *H01L 21/67103* (2013.01)

(58) Field of Classification Search
CPC .............. H01L 21/6833; H01L 21/67103
USPC .......................................... 361/234
See application file for complete search history.

(56) References Cited

U.S. PATENT DOCUMENTS

| 2018/0047604 A1 | 2/2018 | Takemoto et al. |
| 2020/0006095 A1* | 1/2020 | Miwa .................. H01L 21/3065 |
| 2021/0268616 A1* | 9/2021 | Sato .................... H01L 21/6833 |

FOREIGN PATENT DOCUMENTS

| JP | 2001-028036 | 1/2001 |
| JP | 4885366 B2 * | 2/2012 |
| JP | 2016-100474 | 5/2016 |
| JP | 2016100474 A * | 5/2016 |

(Continued)

OTHER PUBLICATIONS

Machine translation of Imanishi et al. Japanese Patent Document JP 2016-100474 A May 2016 (Year: 2016).*

(Continued)

*Primary Examiner* — Kevin J Comber
(74) *Attorney, Agent, or Firm* — Rankin, Hill & Clark LLP (57) ABSTRACT

A substrate fixing device includes: a base plate; and an electrostatic chuck that is fixed to the base plate and configured to adsorb a substrate by electrostatic force. The electrostatic chuck includes: a ceramic layer that is formed of a ceramic and that is configured to adsorb the substrate in a state that the ceramic layer contacts the substrate; a first heater pattern that is disposed on the ceramic layer and configured to generate heat; an insulating resin layer that is disposed on the first heater pattern to cover the first heater pattern; a second heater pattern that is disposed on the insulating resin layer and configured to generate heat; and an electrically conductive member that penetrates the insulating resin layer such that one end of the electrically conductive member contacts a surface of the first heater pattern and the other end of the electrically conductive member contacts a surface of the second heater pattern.

8 Claims, 9 Drawing Sheets (56) References Cited

FOREIGN PATENT DOCUMENTS

JP    2018-026427    2/2018

OTHER PUBLICATIONS

Machine translation of Hayashi et al. Japanese Patent Document JP 4885366 B2 Jan. 2001 (Year: 2001).*
Hayashi Japanese Patent Document JP 4885366 B2 Feb. 2012 (Year: 2012).*

* cited by examiner

FIG.13

SUBSTRATE FIXING DEVICE, ELECTROSTATIC CHUCK AND METHOD OF MANUFACTURING ELECTROSTATIC CHUCK This application claims priority from Japanese Patent Applications No. 2021-082742, filed on May 14, 2021, the entire contents of which are herein incorporated by reference.

BACKGROUND

Technical Field

The present disclosure relates to a substrate fixing device, an electrostatic chuck, and a method of manufacturing the electrostatic chuck.

Background Art

An electrostatic chuck (ESC) is typically provided in a substrate fixing device which adsorbs and retains a wafer, for example, in order to manufacture a semiconductor component. The electrostatic chuck is configured using a ceramic plate in which an electrode is built. The substrate fixing device has a structure in which the electrostatic chuck is fixed to a base plate. When a voltage is applied to the electrode built in the ceramic plate, the wafer is adsorbed to the electrostatic chuck by use of electrostatic force. Since the wafer is adsorbed to the electrostatic chuck so as to be retained by the electrostatic chuck, processes such as microfabrication and etching can be efficiently performed on the wafer.

Such an electrostatic chuck may have a temperature adjustment function to adjust temperature of the wafer. Specifically, for example, a heater electrode may be formed by screen-printing a paste of a metal such as tungsten, so that the heater electrode can be fired simultaneously when the ceramic plate is formed. In addition, in order to obtain high heat uniformity in a wafer mounting face, a technique has been also devised to etch a rolled metal foil on an insulating resin using photolithography to thereby form an external heater electrode.

As the electrostatic chuck using the external heater electrode, an electrode chuck has been examined as follows. In the electrostatic chuck, a heater electrode is divided into two layers of heater electrodes and deposited on a ceramic plate, and the two layers of the heater electrodes are connected through a via. When the heater electrode is divided into the two layers of the heater electrodes, the degree of freedom for designing heater wiring can be improved, and heat uniformity of a wafer mounting face can be further improved by placement of the heater electrodes at complementary positions in the respective layers (see e.g., JP-A-2016-100474, JP-A-2018-026427, and JP-A-2001-028036).

However, when the two layers of the external heater electrodes are installed in the electrostatic chuck, the step of forming the via to connect the layers of the heater electrodes to each other is necessary. Therefore, there is a problem that manufacturing efficiency of the electrostatic chuck is lowered. Specifically, in order to form the via, a via hole is formed in an insulating resin between the two layers of the heater electrodes, for example, by use of a laser or the like, and the via hole is filled with a metal paste. The aforementioned step is performed in order to form one via. Therefore, as the number of vias increases, it is necessary to repeatedly form a via hole and fill the via hole with the metal paste, thereby lowering the manufacturing efficiency of the electrostatic chuck.

SUMMARY

A certain embodiment provides a substrate fixing device. The substrate fixing device includes: a base plate; and an electrostatic chuck that is fixed to the base plate and configured to adsorb a substrate by electrostatic force. The electrostatic chuck includes: a ceramic layer that is formed of a ceramic and that is configured to adsorb the substrate in a state that the ceramic layer contacts the substrate; a first heater pattern that is disposed on the ceramic layer and configured to generate heat; an insulating resin layer that is disposed on the first heater pattern to cover the first heater pattern; a second heater pattern that is disposed on the insulating resin layer and configured to generate heat; and an electrically conductive member that penetrates the insulating resin layer such that one end of the electrically conductive member contacts a surface of the first heater pattern and the other end of the electrically conductive member contacts a surface of the second heater pattern.

A certain embodiment provides an electrostatic chuck. The electrostatic chuck includes: a ceramic layer that is formed of a ceramic and that is configured to adsorb an object; a first heater pattern that is disposed on the ceramic layer and configured to generate heat; an insulating resin layer that is disposed on the first heater pattern to cover the first heater pattern; a second heater pattern that is disposed on the insulating resin layer and configured to generate heat; and an electrically conductive member that penetrates the insulating resin layer such that one end of the electrically conductive member contacts a surface of the first heater pattern and the other end of the electrically conductive member contacts a surface of the second heater pattern.

A certain embodiment provides a method of manufacturing an electrostatic chuck. The method includes steps of: forming a ceramic layer that comprises an electrode and a ceramic surrounding the electrode; forming a first heater pattern on the ceramic layer, wherein the first heater pattern is configured to generate heat; placing an electrically conductive member on a surface of the first heater pattern; providing an insulating resin layer on the ceramic layer to cover the electrically conductive member and the first heater pattern, wherein a metal layer is formed on one face of the insulating resin layer; and patterning the metal layer to form a second heater pattern, wherein the electrically conductive member penetrates the insulating resin layer so as to contact the metal layer in the step of providing the insulating resin layer.

DETAILED DESCRIPTION OF EMBODIMENT

An embodiment of a substrate fixing device, an electrostatic chuck and a method for manufacturing the electrostatic chuck disclosed by the present application will be described below in detail with reference to the drawings. Incidentally, the present disclosure is not limited by the embodiment.

Figure 1:
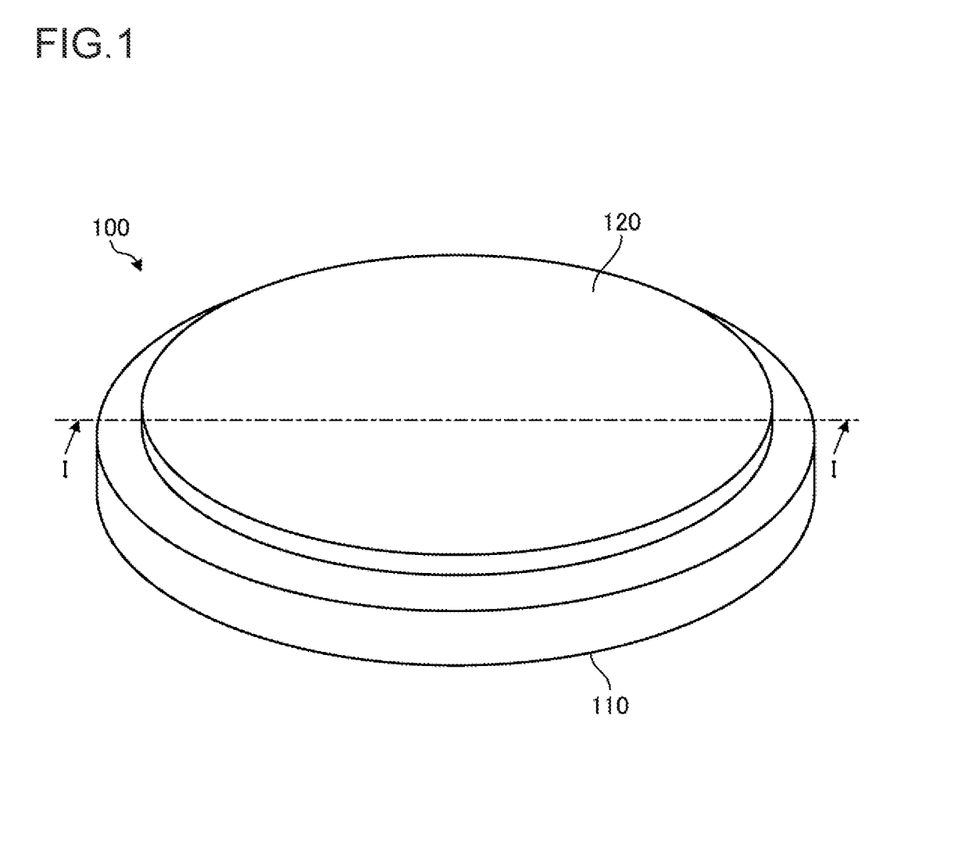
FIG. 1 is a perspective view showing a configuration of a substrate fixing device according to an embodiment.

FIG. 1 is a perspective view showing a configuration of a substrate fixing device 100 according to an embodiment. The substrate fixing device 100 shown in FIG. 1 has a structure in which an electrostatic chuck 120 is adhesively bonded to a base plate 110.

The base plate 110 is a circular member made of a metal such as aluminum. The base plate 110 is a base material to which the electrostatic chuck 120 is fixed. The base plate 110 is, for example, attached to a semiconductor manufacturing apparatus or the like to make the substrate fixing device 100 function as a semiconductor retaining device for retaining a wafer.

The electrostatic chuck 120 adjusts temperature of an object such as a wafer while adsorbing the object using electrostatic force. That is, a ceramic layer adsorbing the object and a heater layer heating the object are provided so that the electrostatic chuck 120 is formed. The electrostatic chuck 120 smaller in diameter than the base plate 110 is fixed to the center of the base plate 110. On this occasion, the heater layer of the electrostatic chuck 120 is adhesively bonded to the base plate 110, so that the electrostatic chuck 120 is fixed to the base plate 110. The ceramic layer is provided on an upper face of the heater layer, so that an adsorption face of the ceramic layer adsorbing the object is exposed.

Figure 2:
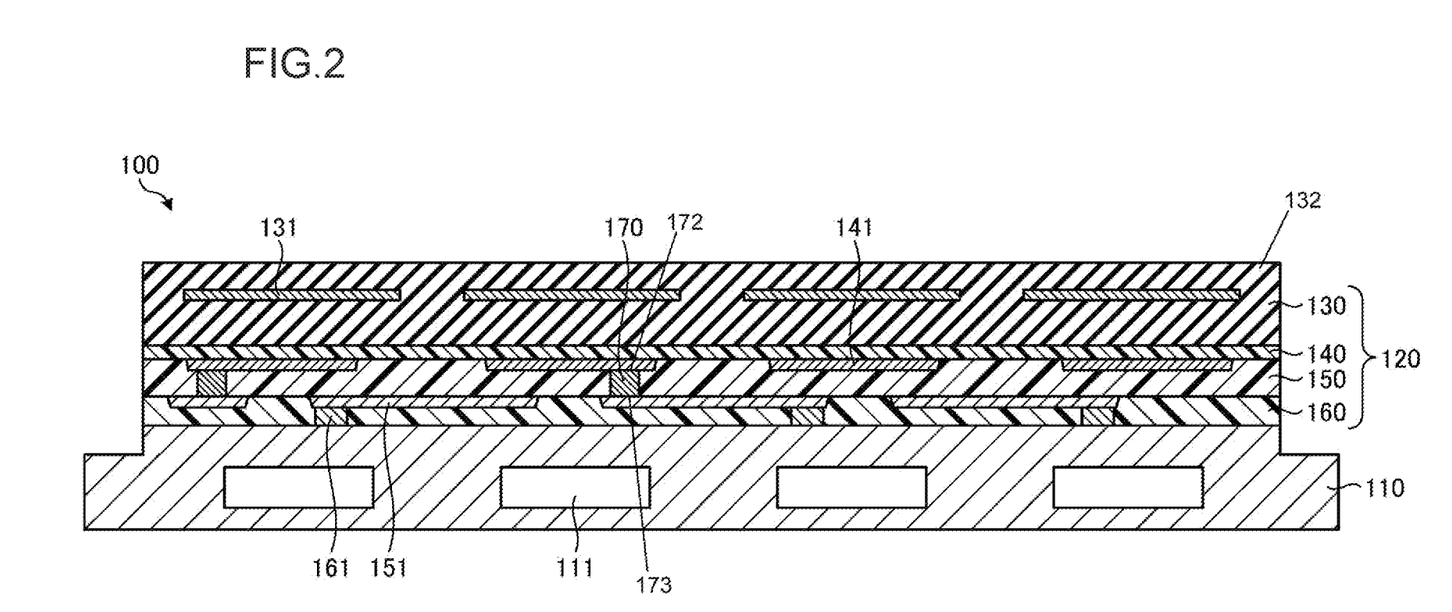
FIG. 2 is a schematic view showing a section of the substrate fixing device according to the embodiment.

FIG. 2 is a schematic view showing a section taken along a line I-I of FIG. 1. As shown in FIG. 2, the substrate fixing device 100 has a configuration in which the electrostatic chuck 120 is adhesively bonded to the base plate 110.

The base plate 110 is a member that is made of the metal and that internally has cooling water channels 111 provided as flow channels for cooling water. For example, the base plate 110 is about 20 mm to 50 mm thick. The base plate 110 is configured to cool the electrostatic chuck 120 by the cooling water that flows into the cooling water channels 111 from outside the substrate fixing device 100. As a result of cooling the electrostatic chuck 120, the object such as the wafer adsorbed to the electrostatic chuck 120 is cooled.

Incidentally, the base plate 110 may have cooling gas channels provided as flow channels for cooling gas, in place of the cooling water channels 111. In short, the base plate 110 has refrigerant passageways through which a refrigerant such as the cooling water or the cooling gas is passed.

The electrostatic chuck 120 has a ceramic layer 130, a first insulating resin layer 140, a second insulating resin layer 150, and a third insulating resin layer 160, and the third insulating resin layer 160 is adhesively bonded to the base plate 110.

The ceramic layer 130 is made of a ceramic 132 inside which electrically conductive electrodes 131 are provided. For example, the ceramic layer 130 is about 4.5 mm thick. The ceramic 132 is obtained by firing green sheets, for example, produced by use of aluminum oxide. By electrostatic force generated due to a voltage applied to the electrodes 131 of the ceramic layer 130, the ceramic layer 130 contacts and adsorbs the object such as a substrate. That is, in FIG. 2, an upper face of the ceramic layer 130 serves as the adsorption face that contacts the object, and the object is adsorbed to the adsorption face when the voltage is applied to the electrodes 131.

The first insulating resin layer 140 is a layer that is formed on the ceramic layer 130 and that is made of an insulating resin having high thermal conductivity and high heat resistance, such as an epoxy resin or a bismaleimide-triazine resin. The first insulating resin layer 140 is, for example, about 40 μm to 100 μm thick. First heater patterns 141 are formed on one face (lower face in FIG. 2) of the first insulating resin layer 140 on an opposite side to the ceramic layer 130.

The first heater patterns 141 are electrodes made of an alloy such as CN49 (constantan) (Cu—Ni—Mn—Fe alloy), Zeranin (Cu—Mn—Sn alloy) or Manganin (Cu—Mn—Ni alloy). The first heater patterns 141 generate heat when a voltage is applied thereto. Thickness of each of the first heater patterns 141 is, for example, about 25 μm to 50 μm, to be included in a range of 15 μm to 200 μm.

The second insulating resin layer 150 is formed on the first insulating resin layer 140 to cover the first heater patterns 141. Like the first insulating resin layer 140, the second insulating resin layer 150 is a layer made of an insulating resin having high thermal conductivity and high heat resistance, such as an epoxy resin or a bismaleimide-triazine resin. The second insulating resin layer 150 is, for example, about 40 μm to 300 μm thick to be thicker than the first insulating resin layer 140. Second heater patterns 151 are formed on one face (lower face in FIG. 2) of the second insulating resin layer 150 on an opposite side to the first insulating resin layer 140.

The second heater patterns 151 are electrodes made of an alloy such as CN49 (constantan) (Cu—Ni—Mn—Fe alloy), Zeranin (Cu—Mn—Sn alloy) or Manganin (Cu—Mn—Ni alloy). The second heater patterns 151 generate heat when a voltage is applied thereto. Thickness of each of the second heater patterns 151 is, for example, about 25 μm to 50 μm, which is included in a range of 15 μm to 200 μm. The second heater patterns 151 are electrically connected to the first heater patterns 141 through electrically conductive members 170 which will be described later.

The third insulating resin layer 160 is formed on the second insulating resin layer 150 to cover the second heater patterns 151. Like the first insulating resin layer 140 and the second insulating resin layer 150, the third insulating resin layer 160 is a layer made of an insulating resin having high thermal conductivity and high heat resistance, such as an epoxy resin or a bismaleimide-triazine resin. Thickness of the third insulating resin layer 160 is, for example, about 40 μm to 300 μm. Power feeding portions 161 feeding electric power from the base plate 110 to the second heater patterns 151 are formed inside the third insulating resin layer 160.

The power feeding portions 161 are electrically conductive members that electrically connect the base plate 110 to the second heater patterns 151. The power feeding portions 161 apply the voltage supplied from the base plate 110 to the second heater patterns 151.

The electrically conductive members 170 are embedded in the second insulating resin layer 150. Each of the electrically conductive members 170 is an electrically conductive member that abuts against a surface of a corresponding one of the first heater patterns 141 at one end and abuts against a surface of a corresponding one of the second heater patterns 151 at the other end. The electrically conductive member 170 has an upper face 172 and a lower face 173 located on an opposite side to the upper face 172. An electrically conductive adhesive sheet is, for example, formed by containing electrically conductive fillers in a resin such as an acrylic resin or a urethane resin. The electrically conductive member 170 is cut out of the electrically conductive adhesive sheet so as to be formed, for example, into a shape of a circular cylinder or a shape of a rectangular cylinder. A bottom diameter of the electrically conductive member 170 that abuts against the corresponding first heater pattern 141 and the corresponding second heater pattern 151 is, for example, about 0.1 mm to 3 mm. In addition, height of the electrically conductive member 170 is equal to a distance between the opposed surfaces of the corresponding first heater pattern 141 and the corresponding second heater pattern 151. The height of the electrically conductive member 170 is, for example, about 60 µm to 70 µm.

The electrically conductive member 170 can be adhesively bonded to the corresponding first heater pattern 141 in a semi-cured state, and is formed from a material that has higher hardness in the semi-cured state than that of the insulating resin forming the second insulating resin layer 150. Accordingly, when the second insulating resin layer 150 is formed on the first insulating resin layer 140 and pressed against the insulating resin layer 140 in a state that one end of the electrically conductive member 170 has been adhesively bonded to the corresponding first heater pattern 141, the other end of the electrically conductive member 170 penetrates the second insulating resin layer 150. As a result, the other end of the electrically conductive member 170 reaches the surface of the corresponding second heater pattern 151 so that the upper face 172 of the electrically conductive member 170 contacts the surface of the corresponding first heater pattern 141 and the lower face 173 of the electrically conductive member 170 contacts the surface of the corresponding second heater pattern 151. Furthermore, the upper face 172 of the electrically conductive member 170 is flush with the surface of the corresponding first heater pattern 141, and the lower face 173 of the electrically conductive member 170 is flush with the surface of the corresponding second heater pattern 151.

When electric power is fed from the base plate 110 to the second heater patterns 151 through the power feeding portions 161 in the substrate fixing device 100 having such a configuration, the electric power is also fed to the first heater patterns 141 through the electrically conductive members 170. When the voltage is applied to the first heater patterns 141 and the second heater patterns 151, the first heater patterns 141 and the second heater patterns 151 generate heat to heat the ceramic layer 130 and heat the object adsorbed to the ceramic layer 130.

In the substrate fixing device 100, temperature of the ceramic layer 130 is adjusted by the heating made by the first heater patterns 141 and the second heater patterns 151 and the cooling made by the base plate 110, so that temperature of the object adsorbed to the ceramic layer 130 can be adjusted to a desired temperature. Incidentally, instead of functioning as the heater electrodes generating heat, the second heater patterns 151 may function as bypass electrodes that electrically connect the electrodes of the first heater patterns 141 to each other or electrically connect the first heater patterns 141 to the power feeding portions 161.

Incidentally, in the case where the second heater patterns 151 function as the bypass electrodes, the second heater patterns 151 may be formed by use of an electric conductor with low resistance, such as copper or a copper alloy. In addition, in the aforementioned substrate fixing device 100, fillers of alumina, aluminum nitride, or the like may be contained in the first insulating resin layer 140, the second insulating resin layer 150 and the third insulating resin layer 160 to improve thermal conductivity of the insulating resin layers.

Figure 3:
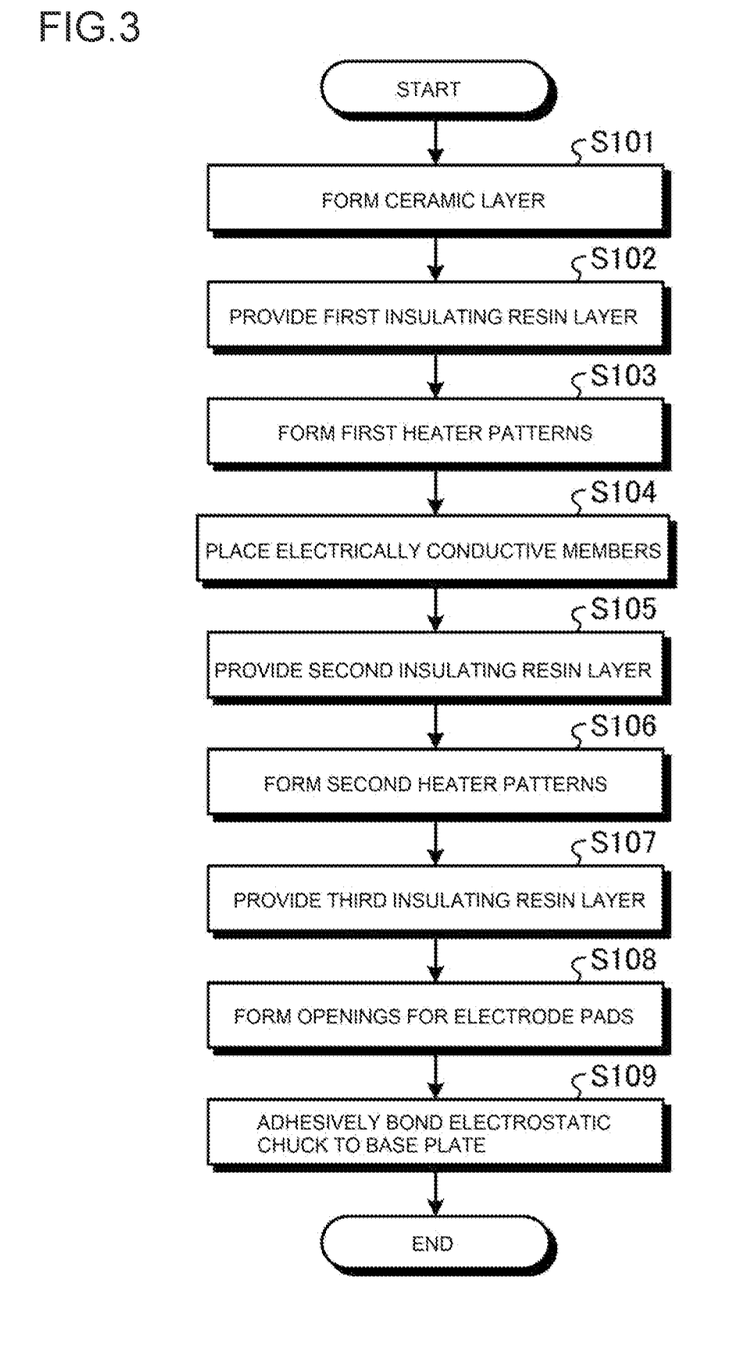
FIG. 3 is a flow chart showing a method for manufacturing the substrate fixing device according to the embodiment.

Next, a method for manufacturing the substrate fixing device 100 having the aforementioned configuration will be described with reference to a flow chart shown in FIG. 3.

Figure 4:
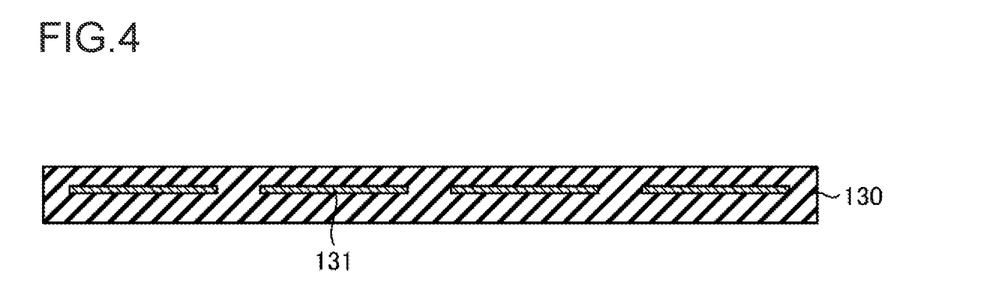
FIG. 4 is a view showing a specific example of a ceramic layer forming step.

First, a ceramic layer 130 for adsorbing an object is formed (step S101). Specifically, for example, a plurality of green sheets containing aluminum oxide as a main material are produced, and electrodes 131 are formed on one face of the green sheets appropriately. The electrodes 131 can be formed, for example, by screen-printing a paste of a metal on the surface of the green sheets. Then, a plurality of green sheets are laminated and fired. As a result, the ceramic layer 130 is formed. The ceramic layer 130 internally has a layer of the electrodes 131, for example, as shown in FIG. 4.

Figure 5:
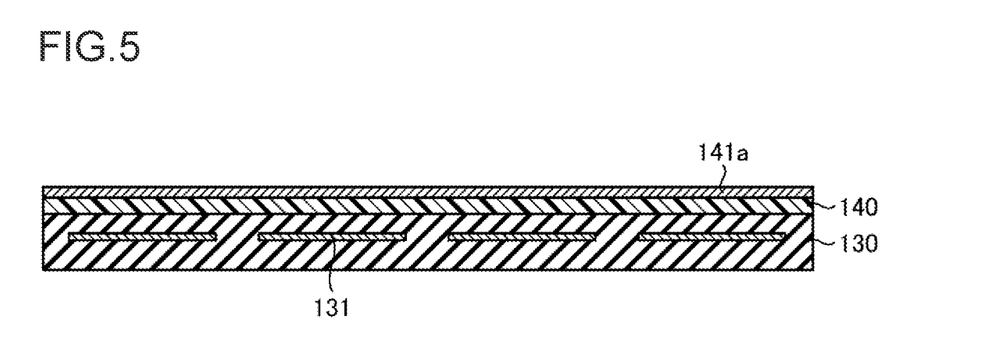
FIG. 5 is a view showing a specific example of a first insulating resin layer depositing step.

When the ceramic layer 130 has been formed, a first insulating resin layer 140 is provided on a surface of the ceramic layer 130 (step S102). A metal foil layer is formed on a face of the first insulating resin layer 140 on an opposite side to the ceramic layer 130. That is, the first insulating resin layer 140 that is, for example, about 40 µm to 100 µm thick including the metal foil layer 141a formed to be, for example, about 25 µm to 50 µm thick on one face of the first insulating resin layer 140 is formed on the surface of the ceramic layer 130, for example, as shown in FIG. 5. The first insulating resin layer 140 and the metal foil layer 141a are tightly bonded to the ceramic layer 130 by vacuum hot press bonding based on vacuum lamination and pressing.

The first insulating resin layer 140 is formed by use of an insulating resin having high thermal conductivity and high heat resistance, such as an epoxy resin or a bismaleimide-triazine resin. In addition, for example, fillers of alumina, aluminum nitride, or the like, may be contained in the first insulating resin layer 140 to improve the thermal conductivity of the first insulating resin layer 140. On the other hand, any rolled alloy that has been exemplified as the material of first heater patterns 141 and second heater patterns 151 can be used as the material of the metal foil layer 141a. That is, the metal foil layer 141a is made of an alloy such as CN49 (constantan) (Cu—Ni—Mn—Fe alloy), Zeranin (Cu—Mn—Sn alloy) or Manganin (Cu—Mn—Ni alloy).

Figure 6:
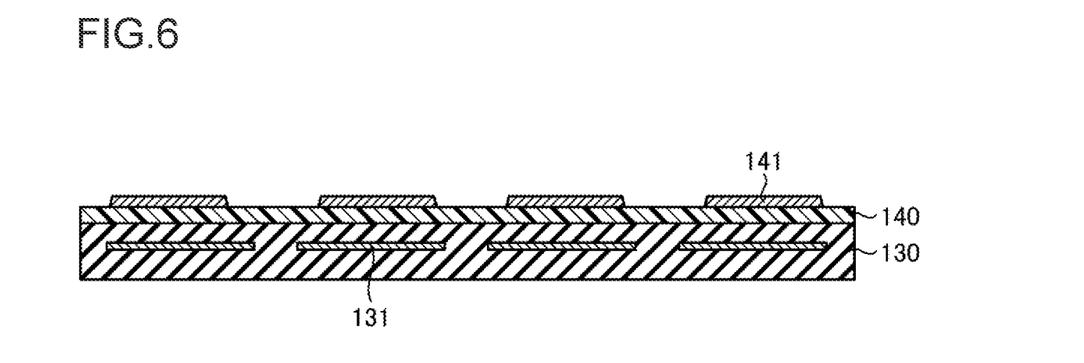
FIG. 6 is a view showing a specific example of a first heater pattern forming step.

When the first insulating resin layer 140 has been provided, the metal foil layer 141a is, for example, etched using photolithography so as to form the first heater patterns 141 having desired patterns (step S103). That is, a resist is formed on an upper face of the metal foil layer 141a, and the resist is exposed to light and developed so that resist patterns are formed to cover portions which should be left as the first heater patterns 141. Then, the metal foil layer 141a exposed without being covered with the resist patterns is removed by etching. As a result, the first heater patterns 141 having desired shapes are formed, for example, as shown in FIG. 6. In FIG. 6, for example, the first heater patterns 141 shaped into two concentric circles are shown sectionally.

Figure 7:
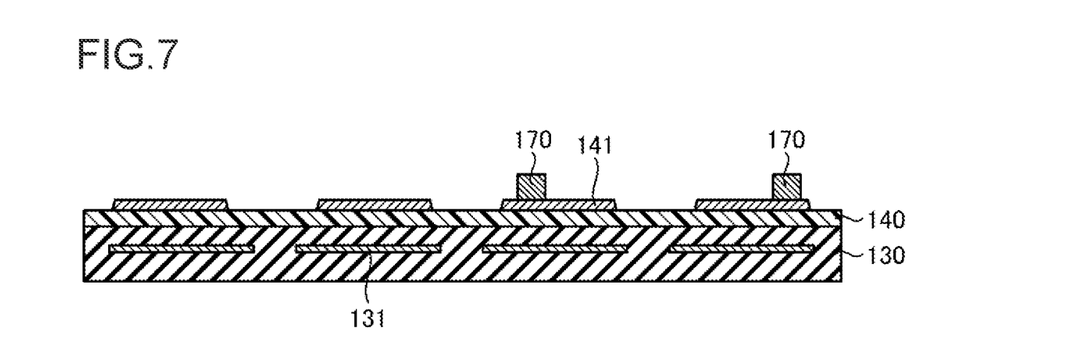
FIG. 7 is a view showing a specific example of an electrically conductive member placing step.

When the first heater patterns 141 have been formed, electrically conductive members 170 are placed on surfaces of the first heater patterns 141 (step S104). Specifically, an electrically conductive adhesive sheet contains conductive fillers in a resin such as an acrylic resin or a urethane resin. The electrically conductive adhesive sheet is 40 μm to 100 μm thick, for example. The electrically conductive members 170 are cut out of the electrically conductive adhesive sheet so as to each have a shape of a circular cylinder with a bottom diameter of about 0.1 mm to 3 mm. The electrically conductive members 170 formed thus are adhesively bonded to the upper faces of the first heater patterns 141. Incidentally, the electrically conductive members 170 may be formed into shapes of circular cylinders or rectangular cylinders cut out from an assembly in which a plurality of electrically conductive adhesive sheets are bonded on top of one another.

The electrically conductive members 170 are placed at positions where they can be electrically connected to the first heater patterns 141 and the second heater patterns 151, for example, as shown in FIG. 7. Since the electrically conductive members 170 are cut out of the electrically conductive adhesive sheet to be formed, the positions of the electrically conductive members 170 can be easily fixed when the electrically conductive members 170 are adhesively bonded to the upper faces of the first heater patterns 141. In addition, at the point of time when the electrically conductive members 170 are adhesively bonded to the first heater patterns 141, the resin forming the electrically conductive members 170 is in a semi-cured state, and the electrically conductive members 170 in the semi-cured state are higher in hardness than an insulating resin in a semi-cured state formed as a second insulating resin layer 150. Incidentally, in order to increase the hardness of the electrically conductive members 170 in the semi-cured state, the electrically conductive members 170 may be heated and cured to a predetermined extent after the electrically conductive members 170 are adhesively bonded to the first heater patterns 141.

Figure 8:
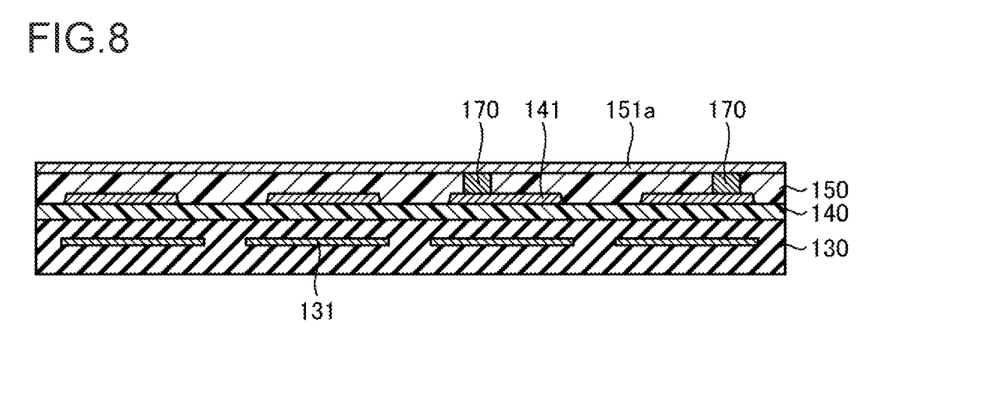
FIG. 8 is a view showing a specific example of a second insulating resin layer depositing step.

When the electrically conductive members 170 have been placed on the first heater patterns 141, the second insulating resin layer 150 is formed to cover the first heater patterns 141 (step S105). A metal foil layer is formed on a face of the second insulating resin layer 150 on an opposite side to the first heater patterns 141. That is, the second insulating resin layer 150 that is, for example, about 40 μm to 100 μm thick including a metal foil layer 151a formed to be, for example, 25 μm to 50 μm thick on one face of the second insulating resin layer 150 is formed on the upper faces of the first insulating resin layer 140 and the first heater patterns 141, for example, as shown in FIG. 8. The second insulating resin layer 150 and the metal foil layer 151a are closely bonded to the first insulating resin layer 140 by vacuum hot press bonding based on vacuum lamination and pressing.

The second insulating resin layer 150 is formed by use of an insulating resin having high thermal conductivity and high heat resistance, such as an epoxy resin or a bismaleimide-triazine resin. In addition, for example, fillers of alumina, aluminum nitride, or the like, may be contained in the second insulating resin layer 150 so as to improve the thermal conductivity of the second insulating resin layer 150. On the other hand, any rolled alloy that has been exemplified as the material of the first heater patterns 141 and the second heater patterns 151 can be used as the material of the metal foil layer 151a. That is, the metal foil layer 151a is made of an alloy such as CN49 (constantan) (Cu—Ni—Mn—Fe alloy), Zeranin (Cu—Mn—Sn alloy) or Manganin (Cu—Mn—Ni alloy).

Incidentally, instead of functioning as heater electrodes generating heat, the second heater patterns 151 may be made to function as bypass electrodes that make electric connection between the electrodes of the first heater patterns 141 or make electric connection between the first heater patterns 141 and the power feeding portions 161. When the second heater patterns 151 are made to function as the bypass electrodes, a metal with low electrical resistance, such as copper or a copper alloy may be used as the material of the metal foil layer 151a.

When the second insulating resin layer 150 is provided, the insulating resin forming the second insulating resin layer 150 is in a semi-cured state and lower in hardness than the electrically conductive members 170. Therefore, the insulating resin forming the second insulating resin layer 150 is pushed out by the electrically conductive members 170. As a result, the electrically conductive members 170 penetrate the second insulating resin layer 150 so that upper ends of the electrically conductive members 170 abut against a lower face of the metal foil layer 151a formed on the surface of the second insulating resin layer 150. Therefore, one ends of the electrically conductive members 170 abuts against the upper faces of the first heater patterns 141, and the other ends of the electrically conductive members 170 abut against the lower face of the metal foil layer 151a. In addition, during the vacuum hot press bonding applied to the second insulating resin layer 150, the second insulating resin layer 150 is cured and the electrically conductive members 170 are also cured by the heating and the pressing. The second insulating resin layer 150 is pressed during the deposition and the electric conductive members 170 are cured. Accordingly, the electrically conductive members 170 can securely contact the lower face of the metal foil layer 151a, and improve connection reliability between the two layers of the heater patterns.

Figure 9:
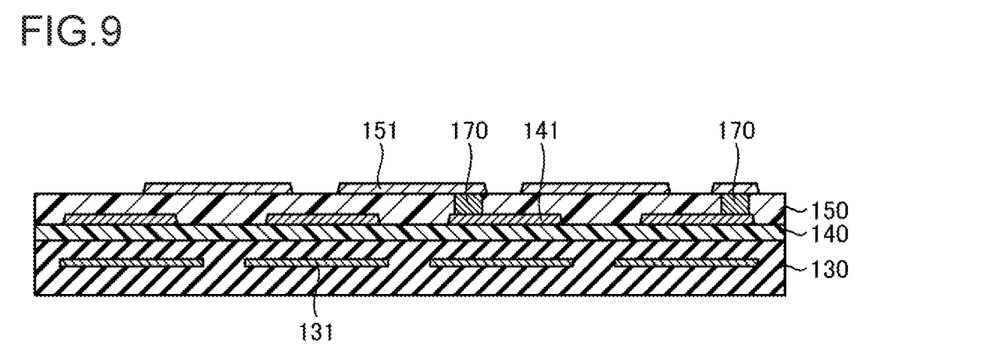
FIG. 9 is a view showing a specific example of a second heater pattern forming step.

When the second insulating resin layer 150 has been provided, the metal foil layer 151a is, for example, etched using photolithography so as to form the second heater patterns 151 having desired patterns (step S106). That is, a resist is formed on an upper face of the metal foil layer 151a, and the resist is exposed to light and developed so that resist patterns are formed to cover portions which should be left as the second heater patterns 151. Then, the metal foil layer 151a exposed without being covered with the resist patterns is removed by etching so as to form the second heater patterns 151 having desired shapes, for example, as shown in FIG. 9. As shown in FIG. 9, the second heater patterns 151 are placed at positions where at least some parts of the second heater patterns 151 do not overlap the first heater patterns 141. That is, at least some parts of the second heater patterns 151 are formed at positions where they overlap with regions where the first heater patterns 141 are not formed in plan view. In addition, the other parts of the second heater patterns 151 are formed at positions where they overlap the first heater patterns 141 in plan view in regions including the positions of the electrically conductive members 170.

Figure 10:
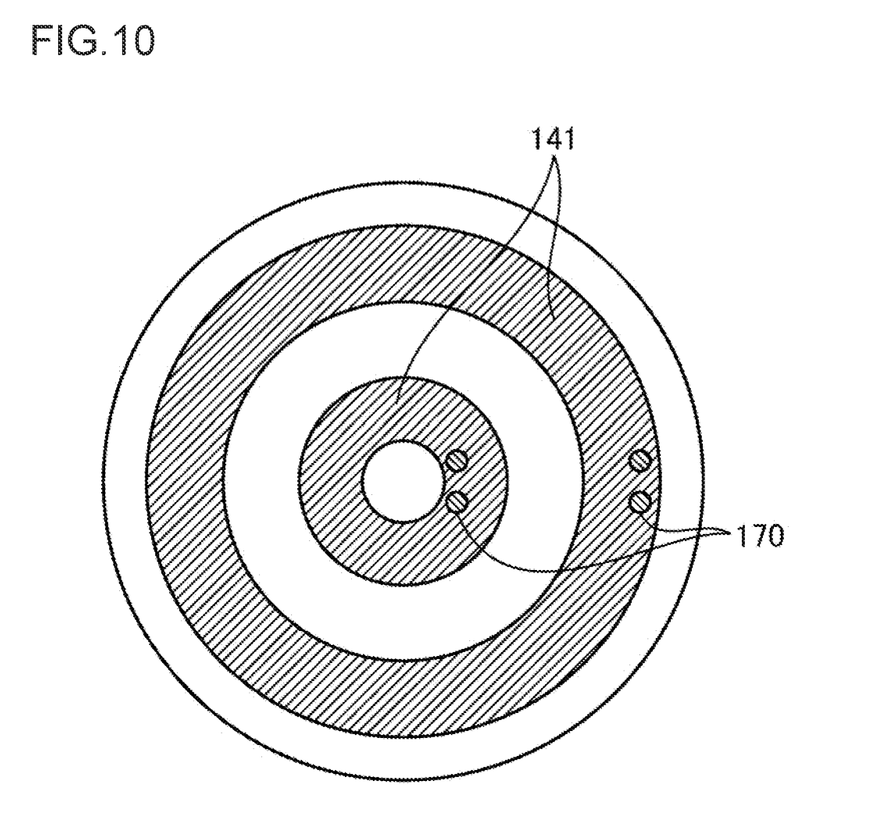
FIG. 10 is a view showing a specific example of first heater patterns.
Figure 11:
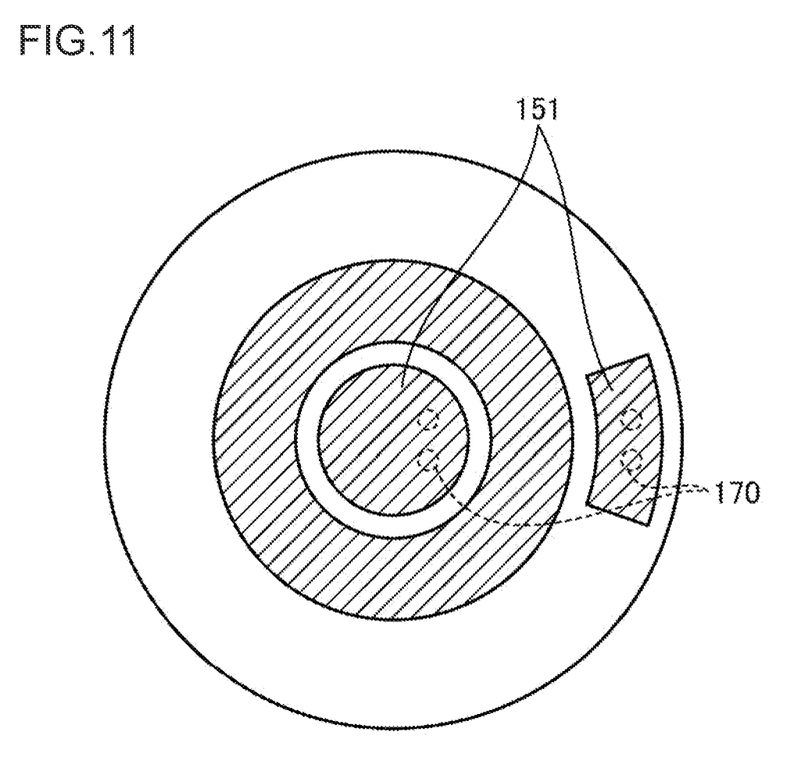
FIG. 11 is a view showing a specific example of second heater patterns.

FIG. 10 is a view showing a specific example of the first heater patterns 141. FIG. 11 is a view showing a specific example of the second heater patterns 151. As shown in FIG. 10, when the first heater patterns 141 are formed into shapes of two concentric circles, the electrically conductive members 170 are formed at the positions where they contact the electrodes forming the concentric circles respectively. When the second heater patterns 151 are formed at the positions where some parts of the second heater patterns 151 overlap the first heater patterns 141 and the other parts of the second heater patterns 151 do not in plan view, as shown in FIG. 11, the electrically conductive members 170 are formed at parts of regions where the second heater patterns 151 overlap the first heater patterns 141 in plan view.

In this manner, in the regions including the positions of the electrically conductive members 170, the first heater patterns 141 and the second heater patterns 151 overlap in plan view, and one ends of the electrically conductive members 170 abut against the upper faces of the first heater patterns 141 while the other ends of the electrically conductive members 170 abut against the lower faces of the second heater patterns 151. Therefore, the first heater patterns 141 and the second heater patterns 151 are electrically connected to each other through the electrically conductive members 170 without going through a via forming step. In other words, the connection between the two layers of the heater patterns can be made by the simple steps, so that manufacturing efficiency of the electrostatic chuck 120 and the substrate fixing device 10 can be improved.

Figure 12:
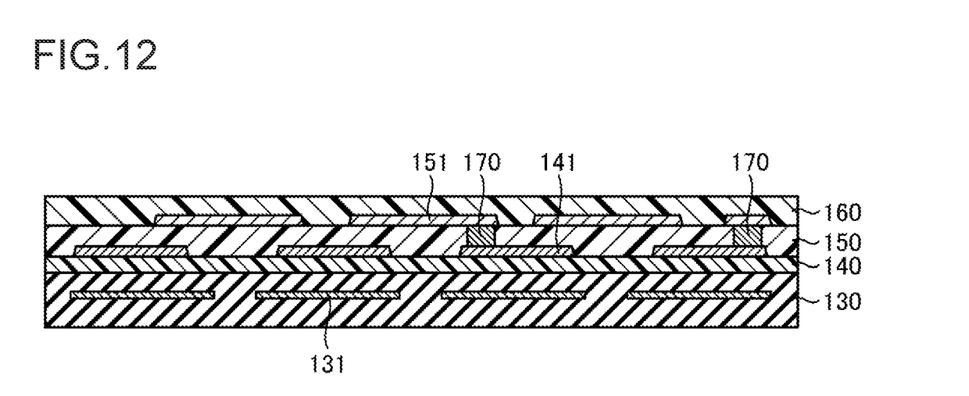
FIG. 12 is a view showing a specific example of a third insulating resin layer depositing step.

When the second heater patterns 151 connected to the first heater patterns 141 through the electrically conductive members 170 have been formed, the third insulating resin layer 160 is formed to cover the second heater patterns 151 (step S107). Specifically, the third insulating resin layer 160 in a semi-cured state is formed so as to cover the second insulating resin layer 150 and the second heater patterns 151. Then, the third insulating resin layer 160 is heated and pressed so that the third insulating resin layer 160 is cured. As a result, the two layers of heaters in which the first heater patterns 141 and the second heater patterns 151 are connected to each other through the electrically conductive members 170 are formed, for example, as shown in FIG. 12.

Figure 13:
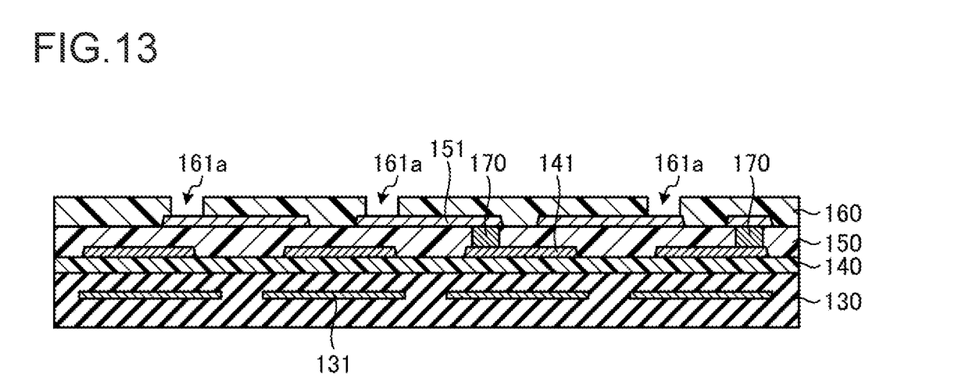
FIG. 13 is a view showing a specific example of an opening forming step.

Then, at positions corresponding to electrode pads in the second heater patterns 151, openings are formed in the third insulating resin layer 160 (step S108). That is, in order to expose the second heater patterns 151 at the positions that will serve as the electrode pads contacting the power feeding portions 161, the openings 161a are formed in the third insulating resin layer 160, for example, as shown in FIG. 13. In this manner, the electrostatic chuck 120 having the two layers of the heater electrodes connected to each other through the electrically conductive members 170 can be obtained.

The electrostatic chuck 120 is adhesively bonded to the base plate 110 by use of an adhesive agent (step S109). Specifically, a face of the third insulating resin layer 160 where which the openings 161a have been formed is adhesively bonded to the base plate 110, for example, by use of a silane coupling agent and the adhesive agent. On this occasion, the positions of the openings 161a are aligned with the positions of the power feeding portions 161 and adhesively bonded thereto. Thus, the power feeding portions 161 and the second heater patterns 151 contact each other so that electric power can be also fed to the second heater patterns 151. Furthermore, the second heater patterns 151 are connected to the first heater patterns 141 through the electrically conductive members 170. Accordingly, the electric power can be also fed to the first heater patterns 141. When the electrostatic chuck 120 is adhesively bonded to the base plate 110, the substrate fixing device 100 is completed.

According to the present embodiment, as described above, the insulating resin layer is formed to cover the first heater patterns in a state that the electrically conductive members have been placed on the surfaces of the first heater patterns, and the electrically conductive members are made to penetrate the insulating resin layer. Then, the front ends of the electrically conductive members that have penetrated the insulating resin layer are made to abut against the second heater patterns. Therefore, the first heater patterns and the second heater patterns can be electrically connected to each other through the electrically conductive members without forming any vias connecting the first heater patterns to the second heater patterns. Consequently, a step of forming via holes in the insulating resin layer and filling the via holes with a metal paste can be dispensed with, so that manufacturing efficiency can be improved.

In addition, in the background-art manufacturing method in which, first, a via hole is formed in the insulating resin layer, and then, a metal paste is filled in the via hole so as to form a via electrically connecting the first heater pattern to the second heater pattern, it is considered that the metal paste cannot be completely filled in the via hole. In such a case, reliability of electrical connection between the via and the heater patterns cannot be sufficiently ensured. On the other hand, according to the present embodiment, the lower and upper faces of the electrically conductive members 170 securely contact the first heater patterns 141 and the second heater patterns 151. Accordingly, reliability of electrical connection between the first heater patterns 141 and the second heater patterns 151 can be further improved by the electrically conductive members 170.

Incidentally, in the aforementioned embodiment, the two layers of the heater electrodes, i.e. the first heater patterns 141 and the second heater patterns 151, are provided in the electrostatic chuck 120. However, three or more layers of heater patterns may be alternatively provided in the electrostatic chuck 120. Even in the case where the three or more layers of the heater patterns are provided, electrically conductive members are placed on a surface of each of the layers of the heater patterns, and an insulating resin layer is deposited thereon from above so that the electrically conductive members penetrate the insulating resin layer to contact the upper layer of the heater patterns. Thus, the upper and lower layers of the heater patterns can be electrically connected easily so that the manufacturing efficiency can be improved.

In addition, in the aforementioned embodiment, the electrode pads are formed in, of the first heater patterns 141, the portions that contact the electrically conductive members 170 or in, of the second heater patterns 151, the portions that contact the power feeding portions 161. The electrode pads are regions each having a diameter of a certain size or more in order to be securely connected to the electrically conductive members 170 or the power feeding portions 161. The circumferences of the electrode pads tend to be blank regions of the heater patterns. Therefore, temperature in the circumferences of the electrode pads tends to be lowered, possibly causing a decrease in heat uniformity.

Therefore, in the aforementioned embodiment, the electrode pads of heater patterns on one layer side may overlap heater patterns on the other layer side, to thereby prevent a drop in temperature around the electrode pads and improve the heat uniformity.

Furthermore, in the aforementioned embodiment, the electrically conductive members 170 are formed of the material containing a resin and electrically conductive fillers in the resin, but the electrically conductive members 170 may be alternatively formed of another electric conductor. However, the electrically conductive members 170 are formed of the material that is higher in hardness than the insulating resin forming the second insulating resin layer 150. Therefore, when the second insulating resin layer 150 is formed so as to cover the first heater patterns 141 on which the electrically conductive members 170 have been placed, the end portions of the electrically conductive members 170 penetrate the second insulating resin layer 150 to contact the metal foil layer 151a.

Although the preferred embodiments etc. have been described above in detail, the present disclosure is not limited to the aforementioned embodiments etc., and various modifications and substitutions can be added to the aforementioned embodiments etc. without departing from the scope described in Claims.

Various aspects of the subject matter described herein are set out non-exhaustively in the following numbered clauses:

1) A method of manufacturing an electrostatic chuck, the method comprising steps of:
forming a ceramic layer that comprises an electrode and a ceramic surrounding the electrode;
forming a first heater pattern on the ceramic layer, wherein the first heater pattern is configured to generate heat;
placing an electrically conductive member on a surface of the first heater pattern;
providing an insulating resin layer on the ceramic layer to cover the electrically conductive member and the first heater pattern, wherein a metal layer is formed on one face of the insulating resin layer; and
patterning the metal layer to form a second heater pattern,
wherein the electrically conductive member penetrates the insulating resin layer so as to contact the metal layer in the step of providing the insulating resin layer.

2) The method according to Clause (1), wherein
in the step of providing the insulating resin layer, the insulating resin layer is pressed and heated, so that the electrically conductive member penetrates the insulating resin layer so as to contact the metal layer.

3) The method according to Clause (1), wherein
the electrically conductive member is formed of a material that is higher in hardness than an insulating resin forming the insulating resin layer.

4) The method according to Clause (1), wherein
the electrically conductive member is formed of a resin containing an electrically conductive filler, and
the electrically conductive member is placed on the surface of the first heater pattern in a semi-cured state.

5) The method according to Clause (1), wherein
the step of placing the electrically conductive member comprises a step of heating the electrically conductive member placed on the first heater pattern so as to harden the electrically conductive member to a predetermined extent.

What is claimed is:

1. A substrate fixing device comprising:
a base plate; and
an electrostatic chuck that is fixed to the base plate and configured to adsorb a substrate by electrostatic force, wherein
the electrostatic chuck comprises:
a ceramic layer that is formed of a ceramic and that is configured to adsorb the substrate in a state that the ceramic layer contacts the substrate;
a first heater pattern that is disposed on the ceramic layer and configured to generate heat;
an insulating resin layer that is disposed on the first heater pattern to cover the first heater pattern;
a second heater pattern that is disposed on the insulating resin layer and configured to generate heat; and
an electrically conductive member that penetrates the insulating resin layer such that one end of the electrically conductive member contacts a surface of the first heater pattern and the other end of the electrically conductive member contacts a surface of the second heater pattern, wherein the electrically conductive member is formed from an electrically conductive adhesive sheet,
wherein the electrically conductive member is formed from a material having a hardness in a semi-cured state which is higher than a hardness of the insulating resin layer.

2. The substrate fixing device according to claim 1, wherein
the electrically conductive member comprises an upper face and a lower face opposite to the upper face,
the upper face of the electrically conductive member is flush with the surface of the first heater pattern, and
the lower face of the electrically conductive member is flush with the surface of the second heater pattern.

3. The substrate fixing device according to claim 1, wherein
the electrically conductive member is formed of a material that includes a resin and an electrically conductive filler contained in the resin.

4. The substrate fixing device according to claim 1, wherein
the electrically conductive member comprises an upper face and a lower face opposite to the upper face,
the upper face contacts the first heater pattern,
the lower face contacts the second heater pattern, and
a diameter of each of the upper and lower faces is in a range of 0.1 mm to 3 mm.

5. The substrate fixing device according to claim 1, wherein
the electrically conductive member overlaps the first heater pattern and the second heater pattern in plan view.

6. The substrate fixing device according to claim 1, wherein
the ceramic layer comprises:
an electrode that is configured to generate electrostatic force according to a voltage applied to the electrode; and
a ceramic that surrounds the electrode.

7. An electrostatic chuck comprising:
a ceramic layer that is formed of a ceramic and that is configured to adsorb an object;
a first heater pattern that is disposed on the ceramic layer and configured to generate heat;
an insulating resin layer that is disposed on the first heater pattern to cover the first heater pattern;
a second heater pattern that is disposed on the insulating resin layer and configured to generate heat; and
an electrically conductive member that penetrates the insulating resin layer such that one end of the electrically conductive member contacts a surface of the first heater pattern and the other end of the electrically conductive member contacts a surface of the second heater pattern, wherein the electrically conductive member is formed from an electrically conductive adhesive sheet,
wherein the electrically conductive member is formed from a material having a hardness in a semi-cured state which is higher than a hardness of the insulating resin layer.

8. The electrostatic chuck according to claim 7, wherein
the electrically conductive member comprises an upper face and a lower face opposite to the upper face, the upper face of the electrically conductive member is flush with the surface of the first heater pattern, and
the lower face of the electrically conductive member is flush with the surface of the second heater pattern.

\* \* \* \* \*